US012660346B2

(12) United States Patent
Prokop et al.

(10) Patent No.: US 12,660,346 B2
(45) Date of Patent: Jun. 16, 2026

(54) DAM AND FILTER FOR SPECTROMETER

(71) Applicant: trinamiX GmbH, Ludwigshafen am Rhein (DE)

(72) Inventors: Christoph Prokop, Ludwigshafen am Rhein (DE); Celal Mohan Oeguen, Ludwigshafen am Rhein (DE); Thomas Hupfauer, Ludwigshafen am Rhein (DE)

(73) Assignee: TRINAMIX GMBH, Ludwigshafen am Rhein (DE)

( * ) Notice: Subject to any disclaimer, the term of this patent is extended or adjusted under 35 U.S.C. 154(b) by 347 days.

(21) Appl. No.: 18/566,461

(22) PCT Filed: Jun. 23, 2022

(86) PCT No.: PCT/EP2022/067099
§ 371 (c)(1),
(2) Date: Dec. 1, 2023

(87) PCT Pub. No.: WO2022/268923
PCT Pub. Date: Dec. 29, 2022

(65) Prior Publication Data
US 2024/0266373 A1 Aug. 8, 2024

(30) Foreign Application Priority Data
Jun. 24, 2021 (EP) .................................... 21181462

(51) Int. Cl.
*H10F 39/00* (2025.01)
(52) U.S. Cl.
CPC ......... *H10F 39/804* (2025.01); *H10F 39/011* (2025.01)

(58) Field of Classification Search
CPC ..... H10F 39/804; H10F 39/011; H10F 39/806
USPC ......................................................... 356/432
See application file for complete search history.

(56) References Cited

U.S. PATENT DOCUMENTS 9,041,790 B2 * 5/2015 Fine ................... G02B 21/0008
                                                    348/79
2017/0213864 A1   7/2017 Chen et al.
2021/0028217 A1   1/2021 Cho et al.

FOREIGN PATENT DOCUMENTS

CN       108649045 A    10/2018
KR    1020120065047 A    6/2012

OTHER PUBLICATIONS

International Search Report and Written Opinion for corresponding PCT/EP22/67099, mailed Jan. 12, 2023, 8 pages.

* cited by examiner

*Primary Examiner* — Md M Rahman
(74) *Attorney, Agent, or Firm* — Armstrong Teasdale LLP

(57) ABSTRACT

Described herein is a method of manufacturing at least one optical detector for optical detection of electromagnetic radiation in a predefined range of interest $\lambda_{[roi]}$.

Also described herein are a method for manufacturing at least one optical detector system having at least two optical detectors, an optical detector, an optical detector system and a spectroscopic sensing application including at least one optical detector system.

12 Claims, 4 Drawing Sheets

DAM AND FILTER FOR SPECTROMETER

CROSS-REFERENCE TO RELATED APPLICATIONS

This application is a U.S. National Phase Application of International Patent Application No. PCT/EP22/67099, filed Jun. 23, 2022, which claims priority to EP Patent Application No. 21181462.9, filed Jun. 24, 2021, each of which is hereby incorporated by reference herein.

TECHNICAL FIELD

The invention relates to a method of manufacturing at least one optical detector for optical detection of electromagnetic radiation in a predefined range of interest $\lambda_{[roi]}$. Further, the invention relates to a method for manufacturing an optical detector system, the optical detector system having at least two optical detectors. Furthermore, the invention relates to an optical detector and to an optical detector system as well as to a spectroscopic sensing application comprising the at least one optical detector. Such methods and devices can be employed for example in various areas of optical sensing and detecting technology, such as in a professional environment, e.g. in devices for medical and physiological diagnostics and research as well as in devices used for quality control and in various other fields of scientific research. Further applications are possible, such as in consumer electronics and household devices, specifically in handheld devices. However, even further applications are feasible.

BACKGROUND ART

Optical detectors in general respond to electromagnetic radiation in a specific wavelength range depending on the material composition of the detector. To further functionalize such detectors, e.g. for spectroscopic sensing applications, filters such as optical windows or bandpass filters can be employed to limit the spectral response of the detector in respect to the center wavelength, the full width half maximum (FWHM) and the blocking range. Typically, for spectroscopic sensing systems, it is possible that more than one detector is required and combined for the intended applications.

US 2021/028217 A1 describes a semiconductor package and a method of fabricating the same. The semiconductor package may include a semiconductor chip structure, a transparent substrate disposed on the semiconductor chip structure, a dam placed on an edge of the semiconductor chip structure and between the semiconductor chip structure and the transparent substrate, and an adhesive layer interposed between the dam and the semiconductor chip structure. The semiconductor chip structure may include an image sensor chip and a logic chip, which are in contact with each other, and the image sensor chip may be closer to the transparent substrate than the logic chip.

US 2017/213864 A1 describes trenched-bonding-dam devices and corresponding methods of manufacture. A trenched-bonding-dam device includes a bonding dam structure positioned upon a top surface of a substrate. The bonding dam structure has a bottom surface attached to a top surface of the substrate, an inner dam surrounded by an outer dam, and a trench between the inner and outer dams. The device may further include an optics system including a lens and an adhesive positioned within a bonding region between a bottom surface of the optics system and a top surface of at least one of the inner and outer dams. The trench may be dimensioned to receive a portion of the excess adhesive flowing laterally out of the bonding region during bonding of the substrate to the optics system, laterally confining the excess adhesive and reducing lateral bleeding of the adhesive.

CN 108649045 A describes a packaging structure which comprises a substrate, a sealing adhesive body and chips. The chips are packaged on the substrate through the sealing adhesive body, at least one sealing adhesive body is arranged on the substrate, the substrate is provided with a first end and a second end which are oppositely arranged, the sealing adhesive body is provided with a first end and a second end, the first end of the sealing adhesive body is arranged at the first end of the substrate, the second end of the sealing adhesive body is arranged at the second end of the substrate, and multiple chips are arranged on the sealing adhesive body; an exhaust groove is formed in the second end of the substrate, and the exhaust groove is connected with the second end of the sealing adhesive body. The packaging structure can effectively improve poor packaging molding. The invention further discloses a camera module.

For limiting the spectral response of the detector, for example in respect to the center wavelength, the full width half maximum (FWHM) and the blocking range, generally, filters such as optical windows or bandpass filters can be employed in order to further functionalize such detectors, e.g. for spectroscopic sensing applications. However, filter mounting and assembly still require high effort and time. Further, for common manufacturing processes with multiple steps typically different manufacturing set-ups for each of the steps are required. These different manufacturing set-ups, in general, increase complexity making the process prone to error and are immensely time consuming, even in case of full automatization.

Furthermore, typically a plurality of detectors and filters are required and combined for use in such intended applications. For the integration of detectors and filters into known devices, such as into consumer devices, household devices, handheld devices or the like, the assemblies have to be very compact. However, in general, and specifically in compact assemblies, stray light and crosstalk, specifically in cases where more than one detector is employed, lead to faulty and distorted measurements. Specifically, stray light or diffracted light that interacts with a pixel without passing the filter or that is intended to interact with a specific pixel, but instead interacts with a different pixel, e.g. with one or more adjacent pixels, typically results in distorted measurements.

These phenomena even become more and more sensitive with the trend to smaller footprints and more densely packed sensor systems.

PROBLEM TO BE SOLVED

It is therefore desirable to provide methods and devices that at least substantially avoid the disadvantages of known methods and devices. In particular, it is an object of the present invention to provide methods and devices aiming for a fast, reliable and cost-effective processing while maintaining a high yield, especially for high volume productions. Thus, it is specifically desirable to provide devices and methods, e.g. smart concepts, for filter mounting and assembly, minimizing stray light and suppression of crosstalk.

SUMMARY

This problem is addressed by a method of manufacturing at least one optical detector, a method of manufacturing at least one optical detector system, an optical detector, an optical detector system and a spectroscopic sensing application with the features of the independent claims. Advantageous embodiments which might be realized in an isolated fashion or in any arbitrary combinations are listed in the dependent claims as well as throughout the specification.

As used herein, the terms "have", "comprise" or "include" or any arbitrary grammatical variations thereof are used in a non-exclusive way. Thus, these terms may both refer to a situation in which, besides the feature introduced by these terms, no further features are present in the entity described in this context and to a situation in which one or more further features are present. As an example, the expressions "A has B", "A comprises B" and "A includes B" may both refer to a situation in which, besides B, no other element is present in A (i.e. a situation in which A solely and exclusively consists of B) and to a situation in which, besides B, one or more further elements are present in entity A, such as element C, elements C and D or even further elements.

Further, it shall be noted that the terms "at least one", "one or more" or similar expressions indicating that a feature or element may be present once or more than once typically are used only once when introducing the respective feature or element. In most cases, when referring to the respective feature or element, the expressions "at least one" or "one or more" are not repeated, nonwithstanding the fact that the respective feature or element may be present once or more than once.

Further, as used herein, the terms "preferably", "more preferably", "particularly", "more particularly", "specifically", "more specifically" or similar terms are used in conjunction with optional features, without restricting alternative possibilities. Thus, features introduced by these terms are optional features and are not intended to restrict the scope of the claims in any way. The invention may, as the skilled person will recognize, be performed by using alternative features. Similarly, features introduced by "in an embodiment of the invention" or similar expressions are intended to be optional features, without any restriction regarding alternative embodiments of the invention, without any restrictions regarding the scope of the invention and without any restriction regarding the possibility of combining the features introduced in such way with other optional or non-optional features of the invention.

In a first aspect, the present invention relates to a method of manufacturing at least one optical detector for optical detection of electromagnetic radiation in a predefined range of interest $\lambda_{[roi]}$. The method comprises the following method steps that may be performed in the given order.

However, a different order may also be possible. Further, one, more than one or even all of the method steps may be performed once or repeatedly. Further, the method steps may be performed successively or, alternatively, two or more method steps may be performed in a timely overlapping fashion or even in parallel. The method may further comprise additional method steps which are not listed.

The method comprises the following steps:

a) providing at least one detector pixel on a circuit carrier;

b) dispensing at least one fluidic material in at least one line on the circuit carrier, such that the line of fluidic material encloses the at least one detector pixel, specifically exactly one detector pixel, and such that the at least one line of fluidic material extends higher from the circuit carrier than the detector pixel;

c) at least partially hardening, specifically curing, the at least one line of fluidic material, such that the at least one line creates a dam enclosing the at least one detector pixel, specifically exactly one detector pixel; and d) depositing at least one filter substrate on the at least one dam, such that the filter substrate is adhesively mounted to the dam and covers the at least one detector pixel on at least one side opposing the circuit carrier.

The term "electromagnetic radiation" as used herein is a broad term and is to be given its ordinary and customary meaning to a person of ordinary skill in the art and is not to be limited to a special or customized meaning. The term specifically may refer, without limitation, to at least one wave of the electromagnetic field radiating through space while carrying electromagnetic radiant energy. The electromagnetic radiation may for example include radio waves, microwaves, infrared radiation, for example near infrared radiation, visible light, specifically light visible to human eyes, ultraviolet radiation, x-rays and gamma rays. Thus, the "electromagnetic radiation in a predefined range of interest $\lambda_{[roi]}$" may specifically refer to electromagnetic radiation having wavelengths within a previously set and/or specified range. As an example, the predefined range of interest $\lambda_{[roi]}$ may specifically refer to a property and/or characteristic of the optical detector, such as to a response range of the at least one detector pixel of the optical detector.

As used herein, the term "detector pixel" is a broad term and is to be given its ordinary and customary meaning to a person of ordinary skill in the art and is not to be limited to a special or customized meaning. The term specifically may refer, without limitation, to an electronic component and/or part configured for generating at least one signal according to a presence of electromagnetic radiation. In particular, the detector pixel may be a sensor unit cell and may specifically comprise at least one photodetector and one or more transistors. In particular, the detector pixel may be or may comprise a photoconductive material, such as polycrystalline lead selenide (PbSe) and/or polycrystalline lead sulfide (PbS).

In step a) of the method, the detector pixel is provided on at least one circuit carrier, wherein the circuit carrier may specifically be or may comprise a printed circuit board. As an example, the circuit carrier may be or may comprise a glass material, such as a glass reinforced epoxy laminate material, e.g. FR4. In particular, the detector pixel may specifically be provided on one or more sheet layers comprising conductive features configured for mechanically supporting and electrically connecting electronic components.

The term "dispensing" as used herein is a broad term and is to be given its ordinary and customary meaning to a person of ordinary skill in the art and is not to be limited to a special or customized meaning. The term specifically may refer, without limitation, to a process of outputting at least one material. In particular, the term may refer to a process of applying a fluidic material onto an arbitrary base element in a structured fashion. Specifically, a dispenser may be used for dispensing the material, e.g. the fluidic material. As an example, dispensing may comprise a process of fluidic material draining from a reservoir of the dispenser onto the base element in a structured fashion, e.g. by performing a relative movement between the dispenser and the base element.

The dispensing in step b) may specifically refer to a process of applying the at least one fluidic material in at least one line, e.g. in a structured fashion, on the circuit carrier, e.g. onto a base element. The term "fluidic material" as used herein is a broad term and is to be given its ordinary and customary meaning to a person of ordinary skill in the art and is not to be limited to a special or customized meaning. The term specifically may refer, without limitation, to an arbitrary at least temporarily liquid and/or viscose material. In particular, the fluidic material may, specifically while being dispensed, have liquid and/or viscose properties. Thus, the fluidic material may, specifically while being dispensed, be an arbitrary material having the ability to flow. Further, the fluidic material may specifically be capable of being at least partially hardened, specifically capable of hardening.

As used herein, the term "hardening" is a broad term and is to be given its ordinary and customary meaning to a person of ordinary skill in the art and is not to be limited to a special or customized meaning. The term specifically may refer, without limitation, to a process of increasing formstability of a material, such as the ability to resist deformation due to gravity. In particular, hardening may refer to a process of increasing the viscosity of a fluidic material. As an example, hardening may be or may comprise a curing and/or cross-linking process. Thus, hardening may specifically refer to a process comprising an arbitrary reaction increasing a materials' formstability by amending the materials' molecular structure and/or by evaporating solvent or softener molecules. In particular, hardening of the at least one line of fluidic material may refer to a curing process, such as to a process wherein, as an example, the viscosity of the fluidic material may be increased. Thus, specifically, the viscosity of the fluidic material may increase during hardening.

In particular, the hardening of step c) may be performed subsequently to the dispensing of step b). Alternatively, however, at least partially hardening the fluidic material may start while still dispensing the fluidic material and thus, steps b) and c) may be performed in a timely overlapping fashion. As an example, such a timely overlap of steps b) and c) may specifically allow for a fast and cost-effective processing.

Furthermore, the depositing in step d) may be performed subsequently to the hardening of step c). However, alternatively, a timely overlap of steps c) and d) may be possible. In particular, the at least one filter substrate may be deposited on the dam while the fluidic material of the dam is still in the process of at least partially hardening.

The term "filter substrate" as used herein is a broad term and is to be given its ordinary and customary meaning to a person of ordinary skill in the art and is not to be limited to a special or customized meaning. The term specifically may refer, without limitation, to a slide and/or sheet of material configured for selectively transmitting electromagnetic radiation, specifically in one or more of the visible, infrared or ultraviolet spectral range. In particular, the filter substrate may be or may comprise a form-stable and/or rigid material. As an example, the filter substrate being adhesively mounted onto the dam may specifically be configured to form a roof-like structure covering the detector pixel.

As used herein, the term "adhesively mounted" is a broad term and is to be given its ordinary and customary meaning to a person of ordinary skill in the art and is not to be limited to a special or customized meaning. The term specifically may refer, without limitation, to a substance-to-substance bond and/or joint between at least two parts and/or materials, the bond being configured for transferring force transfer and/or transmission between the bonded parts and/or materials. Thus, as an example, an external force acting on the filter substrate being adhesively mounted on the dam may be transferred onto the dam, such that the dam may support the external force exerted on the filter substrate.

As an example, in step d), the dam itself, specifically the line of fluidic material at least partially hardened, specifically cured and/or dried, to create the dam, may be or may comprise an adhesive and/or glue for mounting the filter substrate on the dam, such that the filter substrate may be adhesively mounted on the dam by depositing the filter substrate directly on the dam. Additionally or alternatively, a further substance may be used for adhesively mounting the filter substrate on the dam, such as an intermediate layer of adhesive and/or glue.

In particular, the fluidic material dispensed in step b) may specifically be or may comprise one or more of an adhesive, specifically a glue, a hermetic material, specifically a material preventing a passage of gases, and a dielectric material. As an example, the fluidic material may at least partially comprise one or more of an epoxy resin, specifically an epoxy resin with at least one further component, a silane modified polymer and methanol. In particular, the fluidic material may contain methanol. Specifically, the fluidic material may comprise a combination of these materials. Thus, the fluidic material may comprise an epoxy resin with at least one further component, such as for example with methanol. Additionally or alternatively, the fluidic material may comprise a silane modified polymer and optionally further comprise methanol.

The dam, as an example, may consist of more than one line of at least partially hardened fluidic material. Thus, step b) may further comprise dispensing two or more lines on top of each other. Particularly, in step b), two or more lines of fluidic material may subsequently be dispensed on top of each other, specifically such that a stack of lines may be created, wherein, as an example, the stack of lines may then form the dam.

Further, the method may comprise adjusting a height of the dam extending from the circuit carrier according to a predefined numerical aperture of the optical detector, such as by dispensing an appropriate number of lines on top of each other in step b). Specifically, the height of the dam may be chosen to adjust the numerical aperture of the at least one detector. In particular, the height of the dam may reversely and/or oppositely effect the numerical aperture of the detector. Thus, as an example, the higher the dam, e.g. the larger a gap between the filter substrate and the detector pixel, the smaller may be the numerical aperture of the detector, and vice versa.

At least step d) may be performed in an inert atmosphere, specifically in a glovebox, such as in a nitrogen glovebox. Further method steps, such as steps b) and c), or even all of the method steps, may be performed in an inert atmosphere. In particular, the process of depositing the filter substrate on the dam may be performed in an inert atmosphere, e.g. in an atmosphere that allows to avoid unwanted chemical reactions, for example oxidation and hydrolysis reactions, such as in a noble gas atmosphere, e.g. an argon and/or nitrogen gas atmosphere. Thus, as an example, step d) may be performed in an environment comprising a high level of argon and/or nitrogen gas, e.g. more than 80%, preferably more than 90%, more preferably more than 95%. Specifically, for avoiding unwanted chemical reactions, step d) may be performed in an inert atmosphere comprising low levels of chemically reactive components, such as oxygen and/or moisture, e.g. in an atmosphere and/or environment having a high level of noble gas. Thus, for the inert atmosphere, specifically in a glovebox, the principle of the higher the level of noble gas the better may apply.

Further, the circuit carrier, at least one dam and the at least one filter substrate may specifically be configured for forming a hermetically sealed packaging, specifically a hermetically sealed packaging enclosing the detector pixel. Thus, the circuit carrier, the dam and the filter substrate may be configured for preventing passage of fluids, specifically gases and/or gas mixtures, e.g. of air and of oxygen. Furthermore, all junctions and/or connections, specifically between the dam and the circuit carrier and between the dam and the filter substrate, may specifically be hermetically sealed. Thus, the connection between the dam and the circuit carrier may form a hermetic seal and the connection between the dam and the filter substrate may form a hermetic seal. In particular, the packaging enclosing the detector pixel may form a hermetically sealed packaging, such that by performing step d) in the inert atmosphere, the inert atmosphere may also be present within the hermetically sealed packaging enclosing the detector pixel. Specifically, by enclosing the detector pixel in an inert atmosphere within the hermetically sealed packaging, a lifetime of the detector as a whole may be increased, particularly since unwanted chemical reactions between the atmosphere and the detector pixel, such as for example oxidation and/or hydrolysis of the detector pixel, may be avoided. In particular, long-time degradation of the optical detector may be prevented.

The inert atmosphere may specifically comprise a low level and/or concentration of oxygen. Specifically, in the inert atmosphere an oxygen concentration of ≤18 vol.-% may be present. Preferably, in the inert atmosphere an oxygen concentration of ≤15 vol.-% may be present. More preferably, in the inert atmosphere an oxygen concentration of ≤10 vol.-% may be present. Most preferably, in the inert atmosphere an oxygen concentration of ≤5 vol.-% may be present.

The inert atmosphere may specifically comprise a low level and/or concentration of moisture and/or humidity. Specifically, in the inert atmosphere a humidity of ≤5 vol.-% may be present. Preferably, in the inert atmosphere a humidity of ≤3 vol.-% may be present. More preferably, in the inert atmosphere a humidity of ≤1 vol.-% may be present.

Additionally or alternatively, step d) may be performed in a vacuum atmosphere, such as in a vacuum chamber. In particular, the vacuum atmosphere may be or may comprise an atmospheric pressure of ≤0.3 bar. Thus, e.g. as a result of performing at least step d) in a vacuum atmosphere, the hermetically sealed packaging may for example comprise a vacuum atmosphere.

Specifically, the at least one dam, such as the fluidic material hardened, e.g. cured, to create the dam, may be configured such that the dam may form part of the hermetically sealed packaging. In particular, the fluidic material may be of a material, e.g. of a type of glue, configured for allowing hermetic sealing, such as to create at least part of the hermetically sealed packaging, specifically, as hermetically sealing may strongly depend on material properties of the dam, such as on the hardened fluidic material.

The method may specifically further comprise the following step:

e) depositing within the dam at least one spacer element for securing a predefined gap between the detector pixel and the filter substrate.

Specifically, in the method, step e) may be performed before performing step d), such that the at least one spacer element may be deposited within the dam before the at least one filter substrate is deposited on the dam.

The spacer element may specifically be configured for securing a predefined gap between the detector pixel and the filter substrate, e.g. by being present within the gap and/or in close proximity of the gap, such as next to the detector pixel and within the dam. As an example, the spacer element may be or may comprise at least one glass and/or plastic bead having a diameter d, wherein e.g. 50 μm≤d≤250 μm.

The dam may specifically be adapted to essentially block transmission of electromagnetic radiation of a wavelength range $\lambda_{[dam]}$ within or equal to the wavelength range of interest $\lambda_{[roi]}$. As used herein, the term "essentially block" is a broad term and is to be given its ordinary and customary meaning to a person of ordinary skill in the art and is not to be limited to a special or customized meaning. The term specifically may refer, without limitation, to a process of a majority of electromagnetic radiation being stopped or blocked from passing through matter. In particular, the dam being configured for essentially blocking electromagnetic radiation of a wavelength range $\lambda_{[dam]}$ within or equal to the wavelength range of interest $\lambda_{[roi]}$ may specifically be configured for one or both of absorbing or reflecting 95%, preferably 97%, more preferably 99%, of the intensity of electromagnetic radiation having wavelengths within the range $\lambda_{[dam]}$ from transmitting or passing through the dam. Specifically, as an example, the dam may comprise an optical density of two, such as OD2.

Specifically, the wavelength range $\lambda_{[dam]}$ may be or may comprise one or more wavelengths from the near infrared radiation, also referred to as NIR, and the visible light, also referred to as VIS, wavelength range. The VIS-range may specifically comprise wavelengths from 400 nm to 700 nm. The NIR-range may specifically comprise wavelengths from 700 nm to 2500 nm. As an example, the dam may be configured to reduce transmission over the VIS- and/or NIR-range to 5% or less. Additionally or alternatively, a thickness of the dam may be adjustable according to a desired blockage or transmission of electromagnetic radiation. Thus, as an example, the dam may be selected to be thicker, in case a lower transmission may be required. In particular, as an example, a thickness between 450 μm and 600 μm, e.g. 500 μm, may be sufficient for blockage of at least 70% of transmission of electromagnetic radiation.

Specifically, by reducing transmission of electromagnetic radiation through the dam, e.g. in the VIS- and/or NIR-range, crosstalk may be reduced. Crosstalk may specifically refer to electromagnetic radiation intended to interact with a specific detector pixel but instead interacting with another detector pixel, such as with one or more adjacent pixels, e.g. with a detector pixel of another optical detector that may be arranged nearby.

The predefined range of interest $\lambda_{[roi]}$, specifically the wavelength range of interest, may be or may comprise electromagnetic radiation within at least one range between 200 nm and 1 mm. Specifically, $\lambda_{[roi]}$ may be selected, such that 350 nm≤$\lambda_{[roi]}$≤5000 nm, more specifically, such that 1000 nm≤$\lambda_{[roi]}$≤3000 nm.

As an example, the filter substrate deposited in step d) may be or may comprise one or more of a filter slide, a filter sheet and a filter layer. In particular, the filter substrate may have a flat and/or planar basic shape. The filter substrate may further have a form and/or shape of an outline of the dam or at least similar to the outline of the dam. As an example, the filter substrate may be a flat filter slide or layer cut in the shape of a square, a rectangle, a circle or an ellipse.

In particular, the filter substrate deposited in step d) may be adapted to transmit electromagnetic radiation of the wavelength range of interest $\lambda_{[roi]}$. Further, the filter substrate may be adapted to at least partially block transmission of electromagnetic radiation of at least one wavelength range $\lambda_{[filter]}$ having at least one wavelength $\lambda_1$ outside of the wavelength range of interest $\lambda_{[roi]}$.

Thus, as an example, the filter substrate may specifically be configured for one or both of absorbing or reflecting 60%, specifically 80%, more specifically 90%, of the intensity of electromagnetic radiation having wavelengths within the range $\lambda_{[filter]}$ from transmitting or passing through the filter substrate.

The filter substrate may specifically be or may comprise an interference filter. As used herein, the term "interference filter" is a broad term and is to be given its ordinary and customary meaning to a person of ordinary skill in the art and is not to be limited to a special or customized meaning. The term specifically may refer, without limitation, to an optical filter that reflects one or more spectral bands or lines of electromagnetic radiation and transmits others, while maintaining a nearly zero coefficient of absorption. As an example, the interference filter may comprise multiple layers of dielectric material having different refractive indices. In particular, the interference filter comprises wavelength selective properties. Specifically, in case the filter substrate is an interference filter, the filter substrate may be or may comprise one or more of a longpass filter, a shortpass filter, notch filter and a bandpass filter. In particular, in case the filter substrate comprises a bandpass filter, the wavelength range $\lambda_{[filter]}$ may comprise at least two ranges $\lambda_{[filter-low]}$ and $\lambda_{[filter-high]}$, wherein wavelengths in both ranges $\lambda_{[filter-low]}$ and $\lambda_{[filter-high]}$ may essentially be blocked from transmitting or passing through the filter substrate.

In particular, the wavelength ranges $\lambda_{[filter-low]}$ andqj $\lambda_{[filter-high]}$ may refer to broad wavelength ranges having wavelengths outside of the wavelength range of interest $\lambda_{[roi]}$. Thus, as an example, the filter substrate may be configured for absorbing and/or reflecting 60%, specifically 80%, more specifically 90%, of the intensity of electromagnetic radiation having wavelengths between 400 nm and 5000 nm not falling within the wavelength range of interest $\lambda_{[roi]}$. As an example, 400 nm $\lambda_{[filter-low]}$<1000 nm and 3000 nm<$\lambda_{[filter-high]}$≤5000 nm. Such a filter substrate may specifically be or may comprise one or more of a mirror and an absorbent substrate. In such a configuration, the manufactured detector may be referred to as being "dark".

Alternatively, the wavelength ranges $\lambda_{[filter-low]}$ and $\lambda_{[filter-high]}$ may refer to narrow wavelength ranges having wavelengths outside of the wavelength range of interest $\lambda[roi]$. Thus, as an example, the wavelength range $\lambda_{[filter]}$ may be selected depending on a wavelength range detectable by the detector pixel, such as to only block narrow bands of wavelength ranges, e.g. flanking the wavelength range of interest $\lambda[roi]$. As an example, in such a configuration, specifically depending on a wavelength range of electromagnetic radiation reaching the filter substrate, e.g. depending on a wavelength range of a light emitting element, the detector may be referred to as being "light". Further filters may be used, e.g. one or more of a longpass filter, a shortpass filter, a notch filter and a bandpass filter. As an example, a "dark" detector may be less prone to long term detection drift and light degradation than a "light" detector.

Step a) of the method may further comprise connecting the detector pixel to the circuit carrier by at least one bond contact, as an example, by at least one bond contact wire. In particular, in case the detector pixel is connected to the circuit carrier via at least one bond contact, step b) may further comprise dispensing the fluidic material on the circuit carrier around the bond contact such that the fluidic material surrounds the bond contact. Thus, in step b), as an example, the fluidic material may be dispensed such that the bond contacts may be surrounded by the fluidic material. Specifically, step b) may further comprise dispensing the fluidic material such that it is molded around the bond contact, e.g. around the at least one bond wire, specifically in case the bond wire is used for connecting the detector pixel and the circuit carrier. Furthermore, in case of the fluidic material being molded around the bond contact, the fluidic material, specifically the hardened fluidic material, e.g. the dam, may essentially have the same expansion coefficient, e.g. a similar expansion coefficient, as the bond contact. This may specifically allow to avoid damage of the bond contact due to variation in temperature.

In a further aspect of the invention, a method of manufacturing at least one optical detector system having at least two optical detectors is disclosed. The method comprises the following method steps that may be performed in the given order. However, a different order may also be possible. Further, one, more than one or even all of the method steps may be performed once or repeatedly. Further, the method steps may be performed successively or, alternatively, two or more method steps may be performed in a timely overlapping fashion or even in parallel. The method may further comprise additional method steps which are not listed.

The method of manufacturing at least one optical detector system comprises at least steps a) to d) of the method of manufacturing at least one optical detector as described above or as outlined in further detail below, wherein in step a) at least two detector pixels are provided on the same circuit carrier. Thus, with regard to the meaning and/or for possible definitions of terms regarding the method reference may be made to the description given above or as outlined in further detail below.

In particular, in the manufacturing process of the at least one optical detector system, at least one void may exist between at least two adjacent dams of the at least two detectors. Thus, specifically, the method of manufacturing at least one optical detector system may further comprise the following step:

f) filling at least one void between the dam of a first optical detector and the dam of a second optical detector with a fill-material.

In particular, the fill-material may comprise the fluidic material dispensed in step b). Additionally or alternatively, the fill-material may be or may comprise a material that may be optimized for void filling. Specifically, the fill-material may be or may comprise one or more of epoxy, such as an epoxy based material, e.g. an epoxy glue; acrylate, such as an acrylate based material, e.g. an acrylate glue; silicone, such as a silicone based material, e.g. a silicone glue; a hybrid glue.

As an example, step f) may further comprise filling a void between the dam and the filter substrate of a detector, e.g. an unintentionally created void between the dam and the filter substrate, such as by mistake. Thus, the filling of step f) may specifically provide a precautionary void filling, e.g. of possibly unintentionally created voids.

In particular, at least two, more than two or even all of the method steps of both the method of manufacturing the at least one detector and of the method of manufacturing the at least one detector system may be performed in a pick and place set-up, such as within a pick and place apparatus. Thus, as an example, at least steps b), c) and d) of the methods and optionally steps e) and f) may specifically be performed in a pick and place set-up, such as in a pick and place machine that may also be referred to as surface mount technology (SMT) component placement system.

In a further aspect of the invention, an optical detector for an optical detection of electromagnetic radiation in a predefined wavelength range of interest $\lambda_{[roi]}$ is disclosed. The optical detector comprises at least one detector pixel, wherein the detector pixel is arranged on a circuit carrier, the circuit carrier being also comprised by the optical detector. Further, the optical detector comprises at least one dam of at least one hardened line of fluidic material, wherein the detector pixel is enclosed by the at least one dam and wherein the dam extends higher from the circuit carrier than the detector pixel. Furthermore, the optical detector comprises at least one filter substrate, wherein the at least one detector pixel on at least one side of opposing the circuit carrier is covered by the filter substrate and wherein the filter substrate is adhesively mounted to the dam.

The optical detector may specifically be manufactured by using the method of manufacturing an optical detector as described above or as outlined in further detail below. Thus, for possible definitions of terms reference is made to the method as described above or as outlined in further detail below.

The fluidic material, specifically the fluidic material hardened to form the dam, may, for example, be or may comprise one or more of an adhesive, specifically a glue, a hermetic material, specifically a material preventing passage of gases, and a dielectric material.

The dam specifically may be or may comprise two or more hardened lines of fluidic material on top of each other. Thus, the dam may be or may comprise a stack of hardened lines of fluidic material. Further, the height of the dam extending from the circuit carrier may be adjusted according to a predefined numerical aperture of the optical detector. Specifically, in case the dam comprises a plurality of hardened lines of fluidic material stacked on top of each other, the number of hardened lines may be adjusted in order to adjust the height of the dam according to the numerical aperture of the optical detector.

The circuit carrier, the at least one dam and the at least one filter substrate may be configured to form a hermetically sealed packaging enclosing the detector pixel. In particular, the atmosphere within the hermetically sealed packaging formed by the circuit carrier and the dam and the filter substrate may be an inert atmosphere, such as an atmosphere avoiding unwanted chemical reactions, e.g. oxidation and hydrolysis reactions. Thus, the atmosphere within the hermetically sealed packaging may be or may comprise a noble gas atmosphere, e.g. an argon and/or nitrogen gas atmosphere. Specifically, the inert atmosphere within the hermetically sealed packaging formed by the circuit carrier and the dam and the filter substrate may comprise a low level and/or concentration of oxygen. As an example, the oxygen concentration within the hermetically sealed packaging may be ≤18 vol.-%, preferably ≤15 vol.-%, more preferably ≤10 vol.-%, or most preferably ≤5 vol.-%.

Furthermore, the inert atmosphere within the hermetically sealed packaging formed by the circuit carrier and the dam and the filter substrate may comprise a low level and/or concentration of moisture and/or humidity. In particular, the humidity within the hermetically sealed packaging may be ≤5 vol.-%, preferably ≤3 vol.-%, or more preferably ≤1 vol.-%. Additionally or alternatively, the atmosphere within the hermetically sealed packaging formed by the circuit carrier and the dam and the filter substrate may be a vacuum atmosphere.

The optical detector may further comprises at least one spacer element for securing a predefined gap between the detector pixel and the filter substrate. In particular, the spacer element may be positioned within the dam and may be present within the gap and/or in close proximity of the gap, such as next to the detector pixel. As an example, the spacer element may be or may comprise a glass and/or plastic bead with a diameter d, wherein 50 μm≤d≤250 μm.

The dam of the optical detector may specifically be adapted to essentially block transmission of electromagnetic radiation of a wavelength range $\lambda_{[dam]}$ within or equal to the wavelength range of interest $\lambda_{[roi]}$. In particular, the dam may be configured to essentially block transmission of electromagnetic radiation in the NIR and VIS range, such as in a range of wavelengths from 400 nm to 2500 nm. Thus, as an example, the fluidic material hardened to become and/or create the dam may be configured to essentially block transmission of electromagnetic radiation in the VIS and NIR range. However, blockage of further electromagnetic radiation having wavelengths within the wavelength range of interest $\lambda_{[roi]}$ may be possible. Specifically, wavelength range of interest may be or may comprise at least one range between 200 nm and 1 mm. Thus, 200 nm≤$\lambda_{[roi]}$≤1 mm, specifically 350 nm≤$\lambda_{[roi]}$≤5000 nm, or more specifically 1000 nm≤$\lambda_{[roi]}$≤3000 nm.

In particular, the dam may be a multi-functional element. As an example, the dam may serve as a stray light blocker, such as by essentially blocking electromagnetic radiation from transmitting and/or passing through the dam. Furthermore, the dam may serve as a filter holder and a spacer, holding the filter substrate in a predefined and/or controlled orientation on the dam and in a predefined and/or controlled distance to the detector pixel.

The filter substrate of the optical detector may specifically be or may comprise one or more of a filter slide, a filter sheet and a filter layer. In particular, the filter substrate may have a flat and/or planar basic shape, further having a form and/or shape of the outline of the dam or at least similar to the outline of the dam. In particular, the filter substrate may be a flat filter slide or layer cut in the shape of a square, a rectangle, a circle or an ellipse, e.g. according to an outline of the dam.

Further, the filter substrate may specifically be adapted to transmit electromagnetic radiation of the wavelength range of interest $\lambda_{[roi]}$ and to at least partially block transmission of electromagnetic radiation of at least one wavelength range $\lambda_{[filter]}$ having at least one wavelength $\lambda_1$ outside of the wavelength range of interest $\lambda_{[roi]}$. In particular, the filter substrate may be or may comprise at least one interference filter. Thus, as an example, the filter substrate may be or may comprise one or more of a longpass filter, a shortpass filter and a bandpass filter.

The detector pixel of the optical detector may specifically be connected to the circuit carrier via at least one bond contact, specifically via at least one bond wire. In particular, in case the detector pixel is connected to the circuit carrier via the at least one bond wire, the dam may be molded around the at least one bond contact, e.g. the bond wire. For example, the dam being molded around the bond contact may be able to seal and/or bypass the bond contacts. Further, in case of the dam being molded around the bond contact, the hardened fluidic material of the dam may have a similar expansion coefficient as the bond contact. This may specifically increase the optical detectors temperature robustness, as it may allow to avoid damage of the bond contact due to variation in temperature. Furthermore, the optical detectors robustness against mechanical stress may be increased, as the dam being molded around the bond contact may further stabilize the bond contacts and may thus provide extra protection against mechanical strains.

In a further aspect of the present invention, an optical detector system is disclosed. The optical detector system comprises at least two optical detectors, wherein the at least two optical detectors share the at least one circuit carrier. Thus, the optical detector system comprises at least two detector pixels, wherein the detector pixels are arranged on one common and/or shared circuit carrier, the circuit carrier being also comprised by the optical detector system. For possible definitions of terms, reference is made to the optical detector as described above or as outlined in further detail below.

In the optical detector system at least one void between at least two adjacent dams of the at least two detectors may be filled with a fill-material. Thus, the optical detector system may comprise at least one void between the dam of a first optical detector and the dam of a second optical detector being filled with a fill-material. The fill-material may specifically be or may at least partially comprise the at least one fluidic material hardened to create the dam. Additionally or alternatively, the fill-material may be or may comprise a material that may be optimized for void filling. Specifically, the fill-material may be or may comprise one or more of epoxy, such as an epoxy based material, e.g. an epoxy glue; acrylate, such as an acrylate based material, e.g. an acrylate glue; silicone, such as a silicone based material, e.g. a silicone glue; a hybrid glue.

In a further aspect of the invention, a spectroscopic sensing application is disclosed. The spectroscopic sensing application comprising at least one optical detector system as described above or as outlined in further detail below. Thus, for possible definitions of terms reference is made to the optical detector system as described above or as outlined in further detail below.

The methods and devices according to the present invention may provide a large number of advantages over known methods and devices for optical detection of electromagnetic radiation. Thus, specifically the present invention may provide high integration, low technological effort regarding manufacturing and assembly and may be very cost-effective even for large-scale production. In particular, by at least two, more than two or even all of the method steps of both the method of manufacturing the at least one detector and of the method of manufacturing the at least one detector system being performable in a pick and place set-up, the methods may specifically allow for a very cost-effective manufacturing, may further be highly integrational into existing manufacturing processes and may require particularly low efforts for realization. Specifically, the methods and devices according to the present invention may be scalable for high production volumes and may offer high flexibility without high modification effort.

Further, the methods and devices according to the present invention may strongly and effectively reduce crosstalk and thus, negative effects due to crosstalk may be avoided. In particular, crosstalk may be avoided. Furthermore, the methods and devices according to the present invention avoid and/or prevent stray light and/or diffracted light from interacting with a detector pixel without passing the filter substrate. As an example, possible stray light may strongly be minimized by filling the voids between the detectors, such as between dams and/or filter substrates, e.g. between two dams and/or between at least one side-edge of the filter substrate and the dam, in the detector system. The methods and devices according to the present invention may specifically allow to suppress most or even all unwanted electromagnetic radiation and may thus avoid or at least decrease distorted measurements due to crosstalk.

Further, the methods and devices according to the present invention may be able to resist higher mechanical stress than known methods and devices. Specifically, in case spacer elements are being used for securing a predefined gap between the detector pixel and the filter substrate, the spacer elements may further protect the bond contacts, e.g. the bond wires, from mechanical stress and thus may specifically increase the optical detectors robustness regarding mechanical stress. In particular, the bond connections may require a certain radius for bending, such that, as an example, assembling the filter substrate directly on the detector pixel may be difficult, in case the detector pixel is electrically connected to the circuit carrier, e.g. to a rest of the system, via bond contacts. However, by employing spacer elements, such as glass and/or plastic beads, a pre-defined minimum gap between the filter substrate and the detector pixel may be secured, thereby further protecting the bond wires from breaking.

Furthermore, specifically by adjusting the height of the dam according to a predefined numerical aperture of the optical detector, a spectral resolution of the detector may be increased compared to known detectors. In particular, an increase of spectral resolution of the detector by adjusting the height of the dam may be due to the fact that filters, such as optical filters based on an interference effect, e.g. the filter substrate, depending on an incident angle of the electromagnetic radiation, may exhibit a wavelength shift. As an example, such filters, depending on an incident angle of the electromagnetic radiation, may transmit not the specified wavelength, e.g. the characteristic wavelengths they were designed to transmit, but a shifted one. Thus, in case a large numerical aperture may be chosen, e.g. in case of a very small distance between the filter and the detector pixel, not only the desired wavelength but also further wavelengths may pass through the optical filter and subsequently reach the detector pixel. This may specifically lead to a reduction of the spectral resolution of the optical detector and/or the optical detector system. However, by adjusting the height of the dam, this effect may at least partially be suppressed, thus allowing for a smaller reduction of spectral resolution or even a higher spectral resolution than commonly present in known detectors.

Further, the proposed methods and devices may require less space and may allow for a drastic cost reduction compared to known methods and devices. Specifically, the proposed optical detector may be cooled down, e.g. for an improved performance, by simply placing the detector on a cooling system, e.g. on a thermoelectrical cooler, such as on a thermoelectrical cooler based on the Peltier effect. Thus, with the proposed methods and devices it may be possible to forego the need for metal TO-housings in which the cooling system is integrated, as commonly done in known methods and devices, e.g. to prevent icing on the detector pixel due to humidity.

Summarizing and without excluding further possible embodiments, the following embodiments may be envisaged:

Embodiment 1: A method of manufacturing at least one optical detector for optical detection of electromagnetic radiation in a predefined range of interest $\lambda_{[roi]}$, the method comprising:
  a) providing at least one detector pixel on a circuit carrier;
  b) dispensing at least one fluidic material in at least one line on the circuit carrier, such that the line of fluidic material encloses the at least one detector pixel, specifically exactly one detector pixel, and such that the at least one line of fluidic material extends higher from the circuit carrier than the detector pixel;
  c) at least partially hardening, specifically curing, the at least one line of fluidic material, such that the at least one line creates a dam enclosing the at least one detector pixel, specifically exactly one detector pixel; and d) depositing at least one filter substrate on the at least one dam, such that the filter substrate is adhesively mounted to the dam and covers the at least one detector pixel on at least one side opposing the circuit carrier.

Embodiment 2: The method according to the preceding embodiment, wherein the fluidic material dispensed in step b) is one or more of an adhesive, specifically a glue, a hermetic material, specifically a material preventing passage of gases, and a dielectric material.

Embodiment 3: The method according to any one of the preceding embodiments, wherein step b) comprises, e.g. subsequently, dispensing two or more lines on top of each other, specifically such that a stack of lines is created.

Embodiment 4: The method according to any one of the preceding claims, wherein the method further comprises adjusting a height of the dam extending from the circuit carrier according to a predefined numerical aperture of the optical detector by in step b) dispensing on top of each other an appropriate number of lines.

Embodiment 5: The method according to any one of the preceding embodiments, wherein at least step d) is performed in an inert atmosphere, specifically in a glovebox, such as in a nitrogen glovebox, wherein a hermetically sealed packaging is formed by the circuit carrier, the at least one dam and the at least one filter substrate, wherein the hermetically sealed packaging encloses the detector pixel.

Embodiment 6: The method according to the preceding embodiment, wherein in the inert atmosphere is an oxygen concentration of $\leq 18$ vol.-%, preferably of $\leq 15$ vol.-%, more preferably of $\leq 10$ vol.-%, most preferably of $\leq 5$ vol.-%.

Embodiment 7: The method according to any one of the two preceding embodiments, wherein in the inert atmosphere is a humidity of $\leq 5$ vol.-%, preferably of $\leq 3$ vol.-%, more preferably of $\leq 1$ vol.-%.

Embodiment 8: The method according to any one of the preceding embodiments, wherein at least step d) is performed in a vacuum atmosphere.

Embodiment 9: The method according to any one of the preceding embodiments, wherein the method further comprises:

e) depositing within the dam at least one spacer element for securing a predefined gap between the detector pixel and the filter substrate.

Embodiment 10: The method according to the preceding embodiment, wherein the spacer element deposited in step e) is a glass and/or plastic bead with a diameter d, wherein $50 \ \mu m \leq d \leq 250 \ \mu m$.

Embodiment 11: The method according to any one of the preceding embodiments, wherein the dam is adapted to essentially block transmission of electromagnetic radiation of a wavelength range $\lambda_{[dam]}$ within or equal to the wavelength range of interest $\lambda_{[roi]}$.

Embodiment 12: The method according to any one of the preceding embodiments, wherein 200 nm$\leq\lambda_{[roi]}\leq$1 mm, specifically 350 nm$\leq\lambda_{[roi]}\leq$5000 nm, more specifically 1000 nm$\leq\lambda_{[roi]}\leq$3000 nm.

Embodiment 13: The method according to any one of the preceding embodiments, wherein the filter substrate deposited in step d) is one or more of a filter slide, a filter sheet and a filter layer, wherein the filter substrate further has a form and/or shape of or at least similar to an outline of the dam.

Embodiment 14: The method according to any one of the preceding embodiments, wherein the filter substrate deposited in step d) is adapted to transmit electromagnetic radiation of the wavelength range of interest $\lambda_{[roi]}$ and to at least partially block transmission of electromagnetic radiation of at least one wavelength range $\lambda_{[filter]}$ having at least one wavelength $\lambda_1$ outside of the wavelength range of interest $\lambda_{[roi]}$.

Embodiment 15: The method according to any one of the preceding embodiments, wherein the filter substrate deposited in step d) is or comprises at least one interference filter, specifically one or more of a longpass filter, a shortpass filter, a notch filter and a bandpass filter.

Embodiment 16: The method according to any one of the preceding method embodiments, wherein step a) further comprises connecting the detector pixel to the circuit carrier by at least one bond contact, specifically by at least one bond contact wire, and wherein step b) further comprises dispensing the fluidic material on the circuit carrier around the bond contact such that the fluidic material surrounds the bond contact.

Embodiment 17: A method of manufacturing at least one optical detector system having at least two optical detectors, the method comprising the steps of the method of manufacturing at least one optical detector according to any one of the preceding embodiments, wherein in step a) at least two detector pixels are provided on the same circuit carrier.

Embodiment 18: The method according to the preceding embodiment, wherein the method further comprises:

f) filling at least one void between the dam of a first optical detector and the dam of a second optical detector with a fill-material.

Embodiment 19: The method according to the preceding embodiment, wherein the fill-material comprises one or more of the fluidic material dispensed in step b); epoxy, such as an epoxy based material, e.g. an epoxy glue; acrylate, such as an acrylate based material, e.g. an acrylate glue; silicone, such as a silicone based material, e.g. a silicone glue; a hybrid glue.

Embodiment 20: An optical detector for an optical detection of electromagnetic radiation in a predefined wavelength range of interest $\lambda_{[roi]}$, the optical detector comprising:

at least one detector pixel arranged on a circuit carrier;

at least one dam of at least one hardened line of fluidic material, wherein the detector pixel is enclosed by the at least one dam and wherein the dam extends higher from the circuit carrier than the detector pixel;

at least one filter substrate, wherein the at least one detector pixel on at least one side opposing the circuit carrier is covered by the filter substrate and wherein the filter substrate is adhesively mounted to the dam.

Embodiment 21: The optical detector according to the preceding embodiment, wherein the fluidic material, specifically the fluidic material hardened to form the dam, is one or more of an adhesive, specifically a glue, a hermetic material, specifically a material preventing passage of gases, and a dielectric material.

Embodiment 22: The optical detector according to any one of the preceding embodiments referring to an optical detector, wherein the dam is or comprises two or more hardened lines on top of each other, e.g. a stack of hardened lines.

Embodiment 23: The optical detector according to any one of the preceding embodiments referring to an optical detector, wherein a height of the dam extending from the circuit carrier, specifically a number of hardened lines on top of each other, is adjusted according to a predefined numerical aperture of the optical detector.

Embodiment 24: The optical detector according to any one of the preceding embodiments referring to an optical detector, wherein the circuit carrier, the at least one dam and the at least one filter substrate form a hermetically sealed packaging enclosing the detector pixel.

Embodiment 25: The optical detector according to the preceding embodiment, wherein an oxygen concentration within the hermetically sealed packaging is ≤18 vol.-%, preferably ≤15 vol.-%, more preferably ≤10 vol.-%, most preferably ≤5 vol.-%.

Embodiment 26: The optical detector according to any one of the two preceding embodiments, wherein a humidity within the hermetically sealed packaging is ≤5 vol.-%, preferably ≤3 vol.-%, more preferably ≤1 vol.-%.

Embodiment 27: The optical detector according to any one of the three preceding embodiments, wherein there is a vacuum atmosphere within the hermetically sealed packaging.

Embodiment 28: The optical detector according to any one of the preceding embodiments referring to an optical detector, wherein the optical detector further comprises at least one spacer element for securing a predefined gap between the detector pixel and the filter substrate.

Embodiment 29: The optical detector according to the preceding embodiment, wherein the spacer element is a glass and/or plastic bead with a diameter d, wherein 50 $\mu m \leq d \leq 250$ $\mu m$.

Embodiment 30: The optical detector according to any one of the preceding embodiments referring to an optical detector, wherein the dam is adapted to essentially block transmission of electromagnetic radiation of a wavelength range $\lambda_{[dam]}$ within or equal to the wavelength range of interest $\lambda_{[roi]}$.

Embodiment 31: The optical detector according to any one of the preceding embodiments referring to an optical detector, wherein 200 nm$\leq\lambda_{[roi]}\leq1$ mm, specifically 350 nm$\leq\lambda_{[roi]}\leq5000$ nm, more specifically 1000 nm$\leq\lambda_{[roi]}\leq3000$ nm.

Embodiment 32: The optical detector according to any one of the preceding embodiments referring to an optical detector, wherein the filter substrate is one or more of a filter slide, a filter sheet and a filter layer, wherein the filter substrate further has a form and/or shape of or at least similar to the outline of the dam.

Embodiment 33: The optical detector according to any one of the preceding embodiments referring to an optical detector, wherein the filter substrate is adapted to transmit electromagnetic radiation of the wavelength range of interest $\lambda_{[roi]}$ and to at least partially block transmission of electromagnetic radiation of at least one wavelength range $\lambda_{[filter]}$ having at least one wavelength $\lambda_1$ outside of the wavelength range of interest $\lambda_{[roi]}$.

Embodiment 34: The optical detector according to any one of the preceding embodiments referring to an optical detector, wherein the filter substrate is or comprises at least one interference filter, specifically one or more of a longpass filter, a shortpass filter and a bandpass filter.

Embodiment 35: The optical detector according to any one of the preceding embodiments referring to an optical detector, wherein the detector pixel is connected to the circuit carrier via at least one bond contact, specifically via at least one bond wire, wherein the dam is molded around the at least one bond contact.

Embodiment 36: The optical detector according to the preceding embodiment, wherein the hardened fluidic material has essentially the same expansion coefficient as the at least one bond contact, specifically as a bond contact wire.

Embodiment 37: An optical detector system, comprising at least two optical detectors according to any one of the preceding embodiments referring to an optical detector, wherein the at least two optical detectors share the at least one circuit carrier.

Embodiment 38: The optical detector system according to the preceding embodiment, wherein at least one void between the dam of a first optical detector and the dam of a second optical detector is filled with a fill-material.

Embodiment 39: The optical detector system according to the preceding embodiment, wherein the fill-material comprises one or more of the fluidic material; epoxy, such as an epoxy based material, e.g. an epoxy glue; acrylate, such as an acrylate based material, e.g. an acrylate glue; silicone, such as a silicone based material, e.g. a silicone glue; a hybrid glueepoxy, acrylate, silicone or hybrid glue.

Embodiment 40: A spectroscopic sensing application comprising at least one optical detector system according to any one of the preceding embodiments referring to an optical detector system.

SHORT DESCRIPTION OF THE FIGURES

Further optional features and embodiments will be disclosed in more detail in the subsequent description of embodiments, preferably in conjunction with the dependent claims. Therein, the respective optional features may be realized in an isolated fashion as well as in any arbitrary feasible combination, as the skilled person will realize. The scope of the invention is not restricted by the preferred embodiments. The embodiments are schematically depicted in the Figures. Therein, identical reference numbers in these Figures refer to identical or functionally comparable elements.

DETAILED DESCRIPTION OF THE EMBODIMENTS

Figure 1:
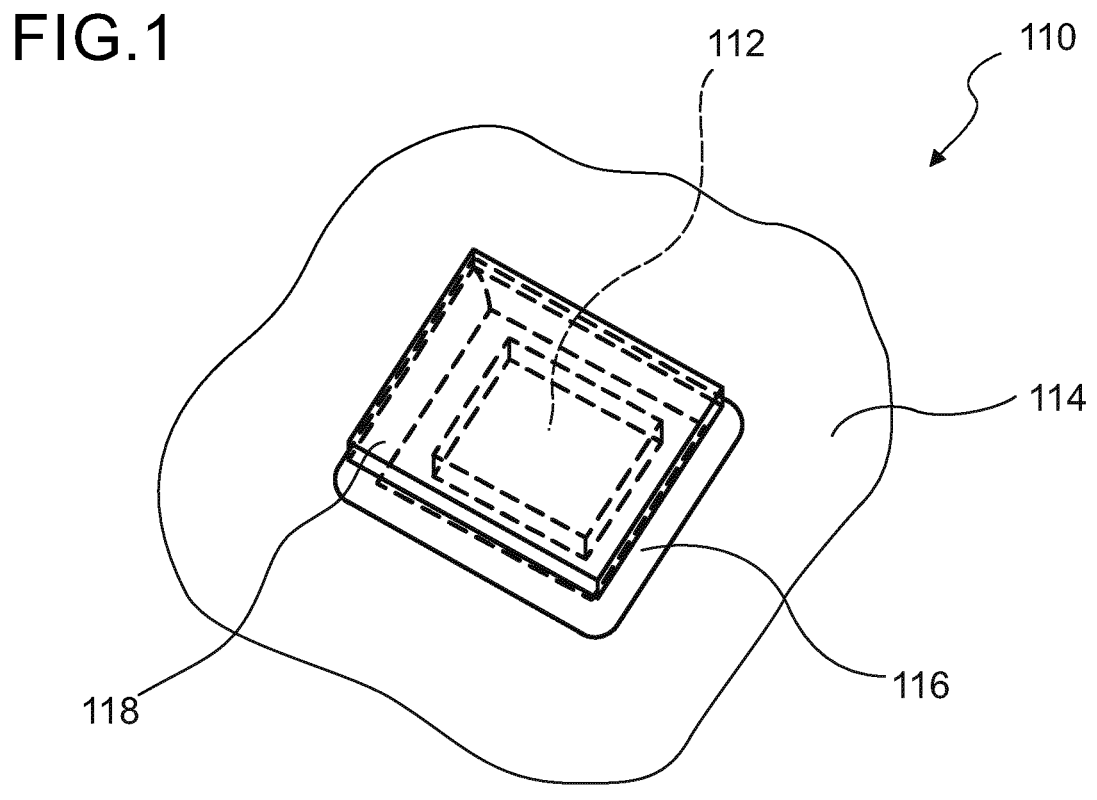
FIG. 1 shows an embodiment of an optical detector in a perspective view.

In FIG. 1, an embodiment of an optical detector 110 for an optical detection of electromagnetic radiation in a predefined wavelength range of interest $\lambda_{[roi]}$ is shown, the optical detector 110 comprising at least one detector pixel 112 arranged on a circuit carrier 114, at least one dam 116 of hardened fluidic material and at least one filter substrate 118 adhesively mounted to the dam 116. As shown in the figure, the dam 116 extends higher from the circuit carrier 114 than the detector pixel 112 and the detector pixel 112 is covered by the filter substrate 118 on a side opposing the circuit carrier 114. For illustrational purposes, in FIG. 1, lines showing the outline of the dam 116 and the detector pixel 112 that are covered by the filter substrate 118 are illustrated in dashed lines.

The circuit carrier 114, the dam 116 and the filter substrate 118 may specifically form a hermetically sealed packaging enclosing the detector pixel 112. Thus, an atmosphere within the hermetically sealed packaging may be different from an atmosphere surrounding the optical detector. The atmosphere within the hermetically sealed packaging may, as an example, be an inert atmosphere allowing to avoid unwanted chemical reactions, such as oxidation and/or hydrolysis reactions, of the detector pixel 112 within the hermetically sealed packaging.

Figure 2:
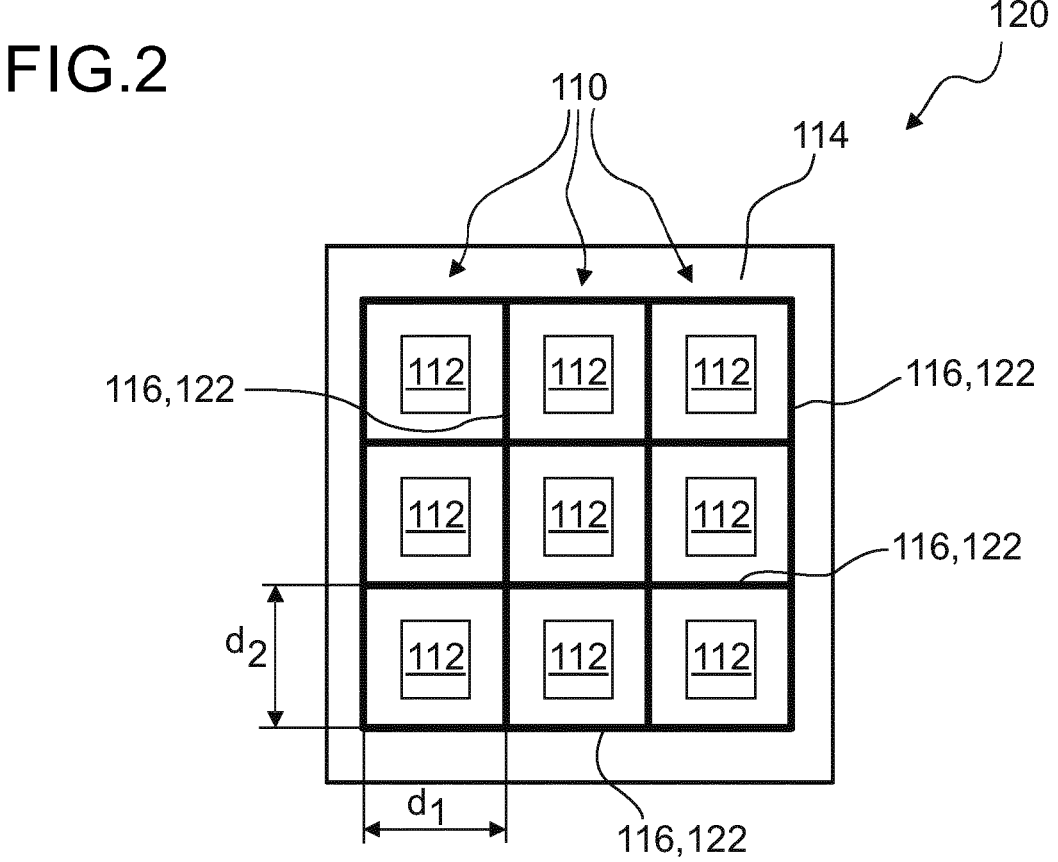
FIG. 2 shows an embodiment of an optical detector system in a cut top plan view.

FIG. 2 shown an embodiment of an optical detector system 120 in a cut view, wherein for illustrational purposes the filter substrate 118 is not shown. The optical detector system 120 comprises a plurality of optical detectors 110, wherein the optical detectors 110 share the at least one circuit carrier 114. Thus, the optical detector system 120 may comprise a plurality of detector pixels 112 all arranged on the one circuit carrier 114. Each of the detector pixels 112 is enclosed by a dam 116, thus, the optical detector system 120 may for each detector pixel 112 comprise one dam 116. Further, the dam 116 extends higher from the circuit carrier 114 than the detector pixel 112.

The dams 116 may be interconnected, such as in a network and/or grid. Specifically, the lines of the fluidic material 122 hardened to create the dams 116 may be connected. Such interconnected dams 116 may be space saving, e.g. on the circuit carrier 114. Specifically, since one line of fluidic material 122 creating the dam 116 may be part of two adjacent dams 116. As an example, line widths and/or thicknesses of 500 μm±10 μm may be possible. In particular, as illustrated in FIG. 2, the dams 116 may form a grid shape, wherein a spacing, such as distances $d_1$ and $d_2$ between the lines of fluidic material 122 creating the grid of dams 116, may be adjusted according to a distance and/or spacing between the detector pixels 112.

Figure 3:
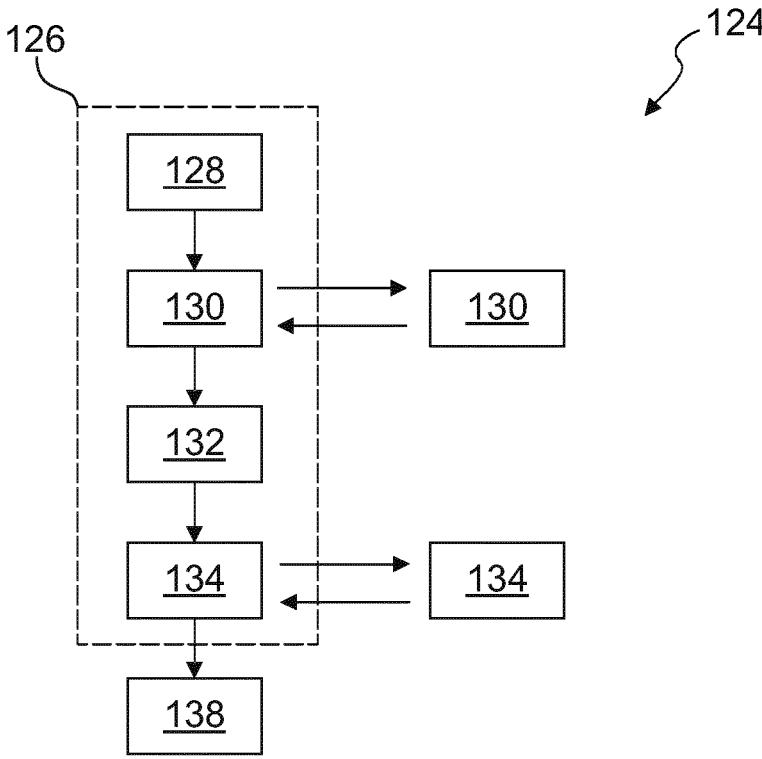
FIGS. 3 and 4 show different flowcharts of a method of manufacturing of an optical detector system with a method of manufacturing of an optical detector.
Figure 4:
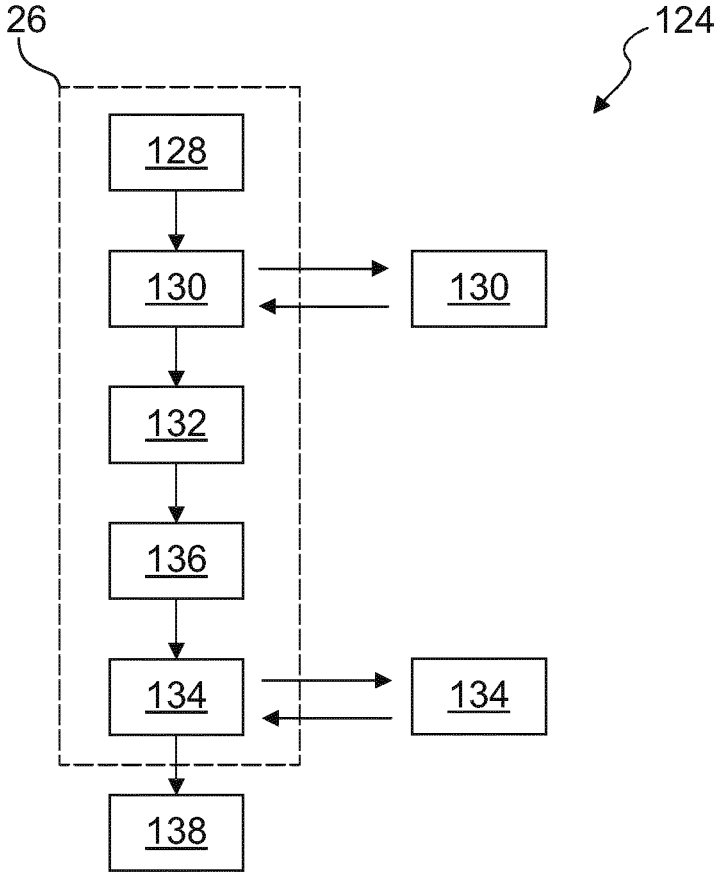

FIGS. 3 and 4 illustrate different flowcharts of a method of manufacturing of an optical detector system (method denoted with reference number 124) with a method of manufacturing of an optical detector (method denoted with reference number 126). The method 126 of manufacturing of an optical detector 112 configured for optical detection of electromagnetic radiation in a predefined range of interest $\lambda_{[roi]}$ comprises at least the following steps:

a) (denoted with reference number 128) providing at least one detector pixel on a circuit carrier;

b) (denoted with reference number 130) dispensing at least one fluidic material in at least one line 122 on the circuit carrier 114, such that the line of fluidic material 122 encloses the at least one detector pixel 112, and such that the at least one line of fluidic material 122 extends higher from the circuit carrier 114 than the detector pixel 112;

c) (denoted with reference number 132) at least partially hardening the at least one line of fluidic material 122, such that the at least one line 122 creates a dam 116 enclosing the at least one detector pixel 112; and d) (denoted with reference number 134) depositing at least one filter substrate 118 on the at least one dam 116, such that the filter substrate 118 is adhesively mounted to the dam 116 and covers the at least one detector pixel 112 on at least one side opposing the circuit carrier 114.

When performing the method 126 of manufacturing of an optical detector 112, steps a) 128 to d) 134 may specifically be performed in the given order, wherein one or more of the method steps, such as steps b) 130 and c) 132 and steps c) 132 and d) 134, may be performed in a timely overlapping fashion, e.g. at least partially simultaneously.

Furthermore, and as exemplarily illustrated in FIG. 4, the method 126 of manufacturing of an optical detector 112 may additionally comprise step:

e) (denoted with reference number 136) depositing within the dam 116 at least one spacer element for securing a predefined gap between the detector pixel 112 and the filter substrate 118.

The method 126 of manufacturing of an optical detector system 120 configured for optical detection of electromagnetic radiation in a predefined range of interest $\lambda_{[roi]}$ comprises at least steps a) 128 to d) 134 of the method 126 of manufacturing of an optical detector 112, wherein in step a) 128 at least two detector pixels 112 are provided on the same circuit carrier 114. Thus, in the method 126 of manufacturing of an optical detector system 120, two or more dams 116 are created and two or more filter substrates 118 are deposited, specifically corresponding to the number of detector pixels 112 that are provided on the circuit carrier 114. Thus, in the method 124 of manufacturing of an optical detector system 120, steps b) 130 and d) 134 may be performed twice or even more often, the number of repetitions e.g. corresponding to the number of detector pixels 112 provided on the circuit carrier 114. In FIGS. 3 and 4, such as repetition of steps is exemplarily illustrated by arrows and boxes arranged on the right side of the figures.

Furthermore, the method 124 of manufacturing of an optical detector system 120 may additionally comprise step:

f) (denoted with reference number 138) filling at least one void 140 between the dam 116 of a first optical detector 142 and the dam 116 of a second optical detector 144 with a fill-material.

In particular, during manufacturing of the optical detector system the void 140 may exist between at least two adjacent dams 116 of the first optical detector 142 and the second optical detector 144, wherein the void 128 may then in step f) 138 be filled with the fill-material.

Figure 5:
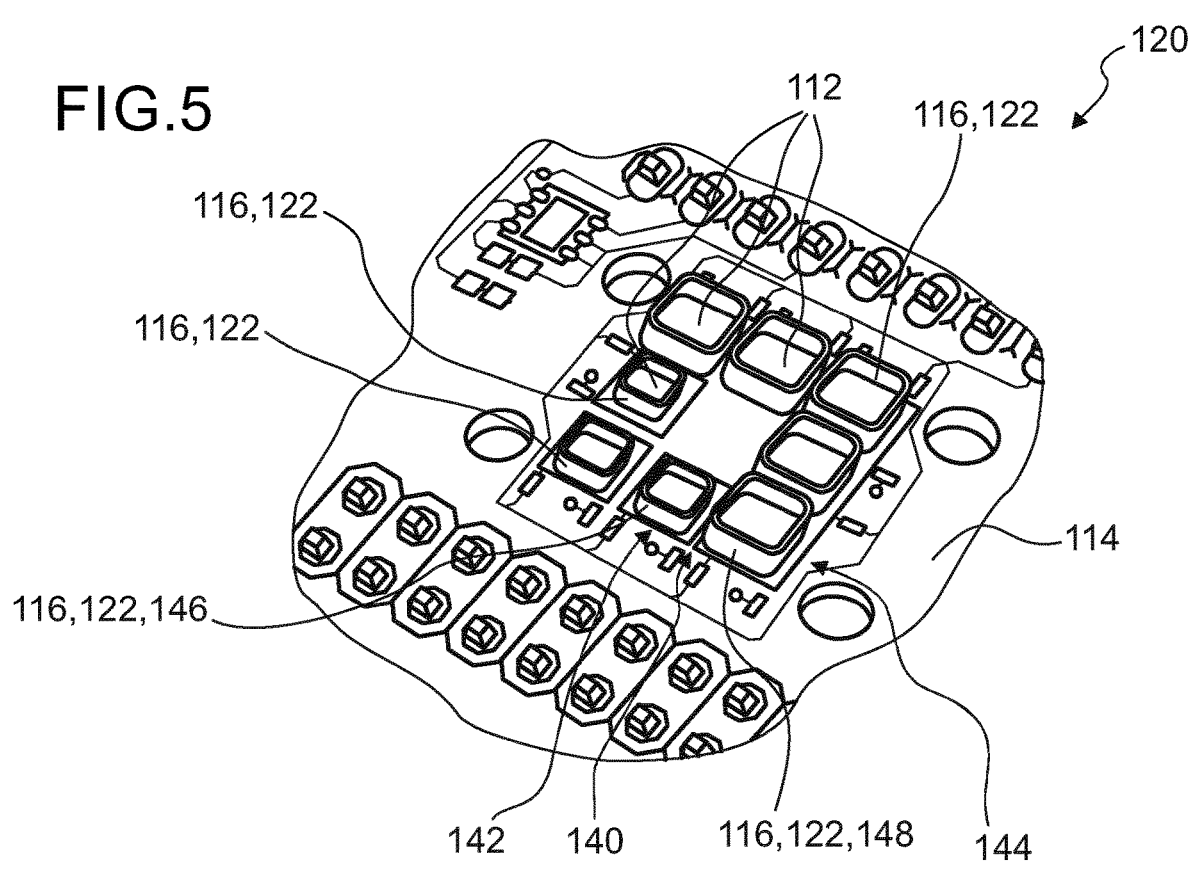
FIGS. 5 and 6 show different states of manufacturing of an embodiment of an optical detector system.
Figure 6:
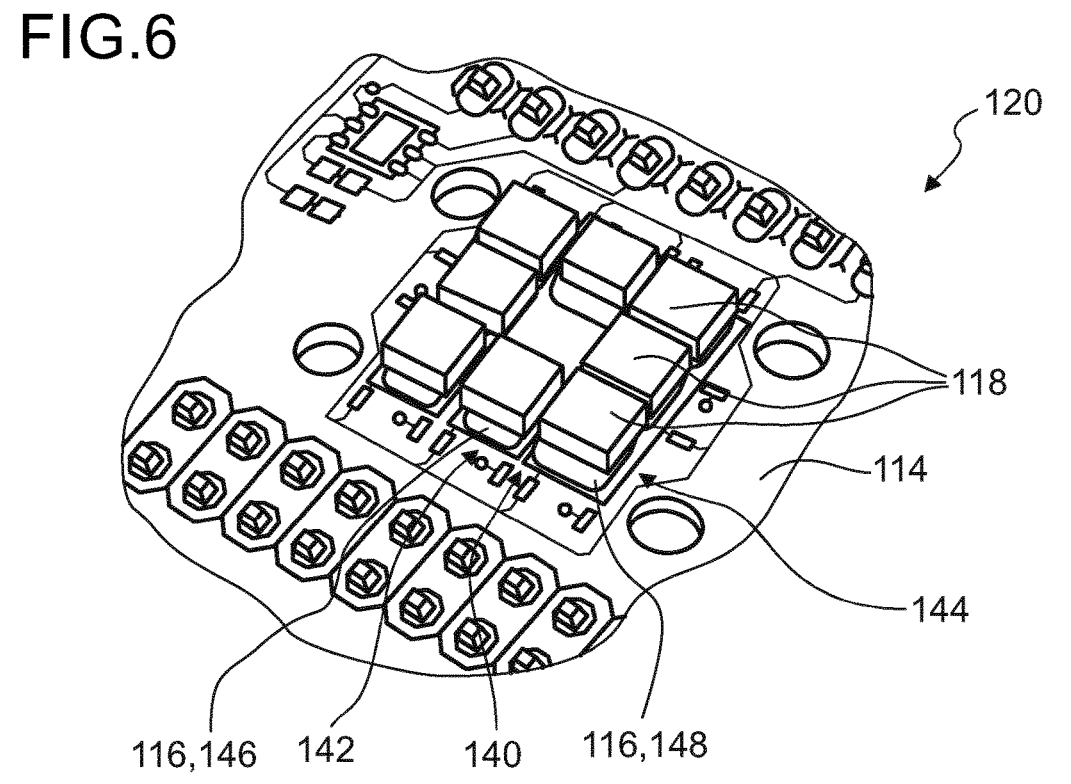

In FIGS. 5 and 6 different states of manufacturing of an embodiment of an optical detector system 120 are shown. Specifically, FIG. 5 illustrates an embodiment of an optical detector system 120, wherein at least the steps a) 128 and b) 130 have been performed. In this state, the optical detector system 120 may specifically comprise a plurality of detector pixels 112 on one shared circuit carrier 114. Enclosing each of the detector pixels 112 are dispensed lines of fluidic material 122 subsequently hardened in step c) 132 to create dams 116. Specifically, a shape of the lines of fluidic material 122 and thus a shape of the dams 116 may vary and may be different for each detector pixel 112 on the circuit carrier 114. Thus, as exemplarily illustrated in FIG. 5, a form and/or shape of a first dam 146 may differ from a form and/or shape of a second dam 148. In particular, one dam 116, e.g. the first dam 146, may form an isolated enclosure around the detector pixel 112, wherein another dam, e.g. the second dam 148, may be connected to one or more adjacent dams 116, e.g. as a part of a grid of dams 116. Specifically, the first dam 146 and the second dam 148 may differ in one or more of shape, spacing and height. As exemplarily illustrated in FIG. 5, the void 140 may, specifically during manufacturing of the optical detector system 120, exist between the first optical detector 142 and the second optical detector 144. In particular, as an example, the void 140 may exist between the first dam 146 and the second dam 148. In FIG. 6, an embodiment of an optical detector system 120 is illustrated wherein at least steps a) 128, b) 130, c) 132 and d) 134 have been performed.

In particular, in this embodiment of the optical detector system 120 filter substrates 118 have been deposited and adhesively mounted on the dams 116.

Figure 7:
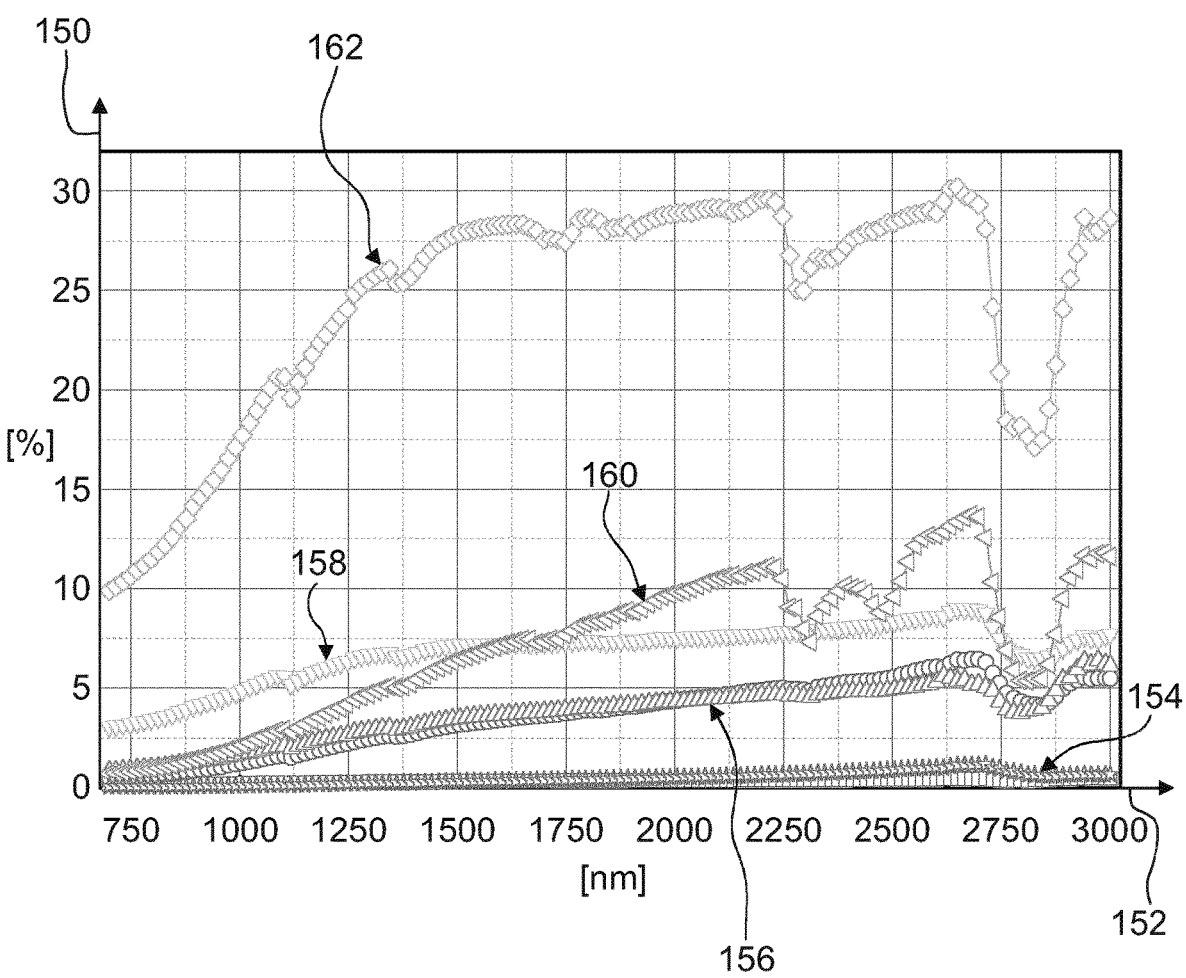
FIG. 7 shows a transmission grade diagram for different fluidic materials.

In FIG. 7, a transmission grade diagram for different fluidic materials is illustrated. Specifically, the diagram shows transmission grades of different fluidic materials depending on a wavelength of electromagnetic radiation. The transmission grades are given on the ordinate (y-axis) in transmission percentage [%], wherein 0% equals no transmission of electromagnetic radiation and 100% equals full transmission, e.g. no blockage of any electromagnetic radiation. Further, the wavelengths of electromagnetic radiation are given on the abscissa (x-axis) in nanometers [nm]. Low transmission grades, particularly under 2%, over the full wide of the illustrated wavelength range of electromagnetic radiation may be possible with an epoxy based fluidic material further comprising methanol, as exemplarily illustrated by a first set of data 154 in the diagram. A further low transmission grade, specifically under 7%, over the full wide of the illustrated wavelength range of electromagnetic radiation may for example be reached with a silane modified polymer based fluidic material comprising methanol, as exemplarily illustrated by a second set of data 156 in the diagram. Further, under 10% transmission grade over the full wide of the illustrated range of electromagnetic radiation may be reached by an epoxy based fluidic material without methanol and over a wide range of electromagnetic radiation may be reached by a silane modified polymer based fluidic material without methanol, as exemplarily illustrated by a third set of data 158 and a fourth set of data 160 in the diagram. Lastly, still under 30% transmission grade over the full wide of the illustrated range of electromagnetic radiation may be reached by a fluidic material comprising a curable polymer, as exemplarily illustrated by a fifth set of data 162.

LIST OF REFERENCE NUMBERS

110 optical detector
112 detector pixel
114 circuit carrier
116 dam
118 filter substrate
120 optical detector system
122 line of fluidic material
124 method of manufacturing of an optical detector system
126 method of manufacturing of an optical detector
128 step a)
130 step b)
132 step c)
134 step d)
136 step e)
138 step f)
140 void
142 first optical detector
144 second optical detector
146 first dam
148 second dam
150 y-axis (transmission grades)
152 x-axis (wavelength of electromagnetic radiation)
154 first set of data
156 second set of data
158 third set of data
160 fourth set of data
162 fifth set of data

The invention claimed is:

1. A method of manufacturing at least one optical detector for optical detection of electromagnetic radiation in a predefined range of interest $\lambda_{[roi]}$, the method comprising:
   a) providing at least one detector pixel on a circuit carrier;
   b) dispensing at least one fluidic material in at least one line on the circuit carrier, such that the line of fluidic material encloses the at least one detector pixel and such that the at least one line of fluidic material extends higher from the circuit carrier than the detector pixel;
   c) at least partially hardening the at least one line of fluidic material, such that the at least one line creates a dam enclosing the at least one detector pixel; and
   d) depositing at least one filter substrate on the at least one dam, such that the filter substrate is adhesively mounted to the dam and covers the at least one detector pixel on at least one side opposing the circuit carrier
   wherein the method further comprises adjusting a height of the dam extending from the circuit carrier according to a predefined numerical aperture of the optical detector by in step b) dispensing on top of each other an appropriate number of lines.

2. The method according to claim 1, wherein the fluidic material dispensed in step b) is one or more of an adhesive, a hermetic material and a dielectric material.

3. The method according to claim 1, wherein at least step d) is performed in an inert atmosphere, wherein a hermetically sealed packaging is formed by the circuit carrier, the at least one dam and the at least one filter substrate, wherein the hermetically sealed packaging encloses the detector pixel.

4. The method according to claim 1, wherein the method further comprises:
   e) depositing within the dam at least one spacer element for securing a predefined gap between the detector pixel and the filter substrate.

5. A method of manufacturing at least one optical detector system having at least two optical detectors, the method comprising manufacturing at least one optical detector according to the method of claim 1, wherein in step a) at least two detector pixels are provided on the same circuit carrier.

6. The method according to claim 5, wherein the method further comprises:
   f) filling at least one void between the dam of a first optical detector and the dam of a second optical detector with a fill-material.

7. An optical detector (110) for an optical detection of electromagnetic radiation in a predefined wavelength range of interest, the optical detector comprising:
   at least one detector pixel arranged on a circuit carrier; at least one dam of at least one hardened line of fluidic material, wherein the detector pixel is enclosed by the at least one dam and wherein the dam extends higher from the circuit carrier than the detector pixel, wherein a height of the dam extending from the circuit carrier is adjusted according to a predefined numerical aperture of the optical detector; and at least one filter substrate, wherein the at least one detector pixel on at least one side opposing the circuit carrier is covered by the filter substrate and wherein the filter substrate is adhesively mounted to the dam;
   wherein the fluidic material is one or more of an adhesive, a hermetic material and a dielectric material.

8. The optical detector according to claim 7, wherein the circuit carrier, the at least one dam and the at least one filter substrate form a hermetically sealed packaging enclosing the detector pixel.

9. The optical detector according to claim 7, wherein the optical detector further comprises at least one spacer element for securing a predefined gap between the detector pixel and the filter substrate.

10. An optical detector system comprising at least two optical detectors according to claim 7, wherein the at least two optical detectors share the at least one circuit carrier.

11. The optical detector system according to claim 10, wherein at least one void between the dam of a first optical detector and the dam of a second optical detector is filled with a fill-material.

12. A spectroscopic sensing application comprising at least one optical detector system according to claim 10.

* * * * *